United States Patent
Lin

(10) Patent No.: US 9,385,677 B2
(45) Date of Patent: Jul. 5, 2016

(54) METHOD AND APPARATUS FOR GAIN ENHANCEMENT OF DIFFERENTIAL AMPLIFIER

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 98 days.

(21) Appl. No.: 14/472,564

(22) Filed: Aug. 29, 2014

(65) Prior Publication Data

US 2016/0065157 A1    Mar. 3, 2016

(51) Int. Cl.
*H03F 3/45* (2006.01)
*H03G 3/30* (2006.01)
*H03F 1/34* (2006.01)

(52) U.S. Cl.
CPC .. *H03G 3/30* (2013.01); *H03F 1/34* (2013.01); *H03F 3/45076* (2013.01); *H03F 3/45475* (2013.01); *H03F 2200/129* (2013.01); *H03F 2203/45116* (2013.01); *H03F 2203/45222* (2013.01); *H03F 2203/45288* (2013.01); *H03F 2203/45512* (2013.01)

(58) Field of Classification Search
CPC ........................................................ H03F 3/45
USPC .................................. 330/69, 82, 9, 104, 260
See application file for complete search history.

(56) References Cited

U.S. PATENT DOCUMENTS

| | | | | |
|---|---|---|---|---|
| 4,609,877 A | * | 9/1986 | Nicollini et al. | 330/9 |
| 5,070,305 A | * | 12/1991 | Confalonieri et al. | 330/69 |
| 6,121,831 A | * | 9/2000 | Mack | 330/9 |
| 8,497,739 B2 | * | 7/2013 | Koyama | 330/301 |
| 2013/0147548 A1 | * | 6/2013 | Ikeda | 330/104 |

* cited by examiner

*Primary Examiner* — Henry Choe

(74) *Attorney, Agent, or Firm* — McClure, Qualey & Rodack, LLP

(57) ABSTRACT

A differential amplifier circuit and method having a feed-in network coupling an input signal to an intermediate signal. An amplifier amplifies the intermediate signal by a gain factor to output an output signal to a load network. A feedback network configured in a negative feedback topology and couples the output signal to the intermediate signal. A gain enhancing network is configured in a positive feedback topology and couples the output signal to the intermediate signal. Preferably, an impedance of the gain enhancing network is approximately equal to an impedance of a parallel connection of the feed-in network and the feedback network times the gain factor minus one.

10 Claims, 4 Drawing Sheets

METHOD AND APPARATUS FOR GAIN ENHANCEMENT OF DIFFERENTIAL AMPLIFIER

BACKGROUND OF THE INVENTION

1. Field of the Invention

The present invention generally relates to differential amplifier circuits and more particularly to gain enhancement of differential amplifier circuits.

2. Description of Related Art

Persons of ordinary skill in the art understand terms and basic concepts related to microelectronics that are used in this disclosure, such as "differential amplifier," "positive feedback," "negative feedback," "impedance," "gain," "DC (direct current) gain," "transconductance," "output resistance," "parasitic capacitance," and "parasitic resistance." Terms and basic concepts like these are apparent from prior art documents, e.g. text books such as "Design of Analog CMOS Integrated Circuits" by Behzad Razavi, McGraw-Hill (ISBN 0-07-118839-8), and thus will not be explained or defined herein.

A differential amplifier receives an input signal comprising a first end and a second end and outputs an output signal also comprising a first end and a second end, such that a difference between the first end and the second end of the output signal is greater than a difference between the first end and the second end of the input signal by a gain factor. In many cases, it is desirable for a differential amplifier to have a high gain. In many cases, a high gain, however, is not easy to attain. Zeller et al disclosed a method to enhance a gain of a differential amplifier in "A 0.039 mm2 inverter-based 1.82 mW 68.6 dB-SNDR 10 MHz-BW CT-$\Sigma\Delta$-ADC in 65 nm CMOS," IEEE Journal of Solid-State Circuits, VOL. 49, NO. 7, July 2014. However, the method taught by Zeller et al relies on using a cross-coupled latch for gain enhancement, which consumes power and also introduces noise that is approximately equal to a noise contribution from a feed-in network of the differential amplifier, as explained in the aforementioned paper.

What is desired is a method and circuit for enhancing a gain of a differential amplifier without consuming extra power and introducing excess noise.

BRIEF SUMMARY OF THIS INVENTION

An objective of the present invention is to remedy a frequency response of a circuit at low frequencies due to an insufficient DC (direct current) gain of a differential amplifier therein by using a positive feedback gain enhancing network. A further objective of the present invention is to remedy a frequency response of the circuit at high frequencies due to an undesired direct feed-through signal from an input of the circuit to an output of the circuit by applying a direct feedforward signal line from the input of the circuit to the output of the circuit.

In an embodiment, a circuit comprises: a feed-in network coupling an input signal to an intermediate signal; an amplifier amplifying the intermediate signal by a gain factor to output an output signal to a load network; a feedback network configured in a negative feedback topology coupling the output signal to the intermediate signal; and a gain enhancing network configured in a positive feedback topology coupling the output signal to the intermediate signal. An impedance of the gain enhancing network is higher than an impedance of a parallel connection of the feed-in network and the feedback network by a factor approximately equal to a gain of the differential amplifier minus one. In a further embodiment, the circuit further comprises a feedforward network coupling the input signal to the output signal. An impedance of the feedforward network is approximately equal to a sum of the impedance of the feed-in network and an impedance of the feedback network.

In an embodiment, a method comprises: receiving an input signal; coupling the input signal to an intermediate signal via a feed-in network; amplifying the intermediate signal by a gain factor to generate an output signal; coupling the output signal to the intermediate signal via a feedback network configured in a negative feedback topology; and coupling the output signal to the intermediate signal via a gain enhancing network configured in a positive feedback topology, wherein an impedance of the gain enhancing network is approximately equal to an impedance of a parallel connection of the feed-in network and the feedback network times the gain factor minus one. In a further embodiment, the method further comprises coupling the input signal to the output signal via a feedforward network, wherein an impedance of the feedforward network is approximately equal to a sum of the impedance of the feed-in network and an impedance of the feedback network.

DETAILED DESCRIPTION OF THE DRAWINGS

DETAILED DESCRIPTION OF THIS INVENTION

The present invention is directed to a novel differential amplifier. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring or diluting aspects of the invention.

Throughout this disclosure: a differential signaling is used, wherein a signal is defined by a voltage comprising a first end denoted by a subscript "+" and a second end denoted by a subscript "−" and the signal is defined as a voltage of the first end minus a voltage of the second end; for instance, a signal $V_I$ comprises a first end $V_{I+}$ and a second end $V_{I-}$ and the signal $V_I$ is equal to $V_{I+}$-$V_{I-}$. For brevity, reference is made to $V_I$, but it will be understood that when reference is made to $V_I$, both $V_{I+}$ and $V_{I-}$ are involved.

Figure 1:
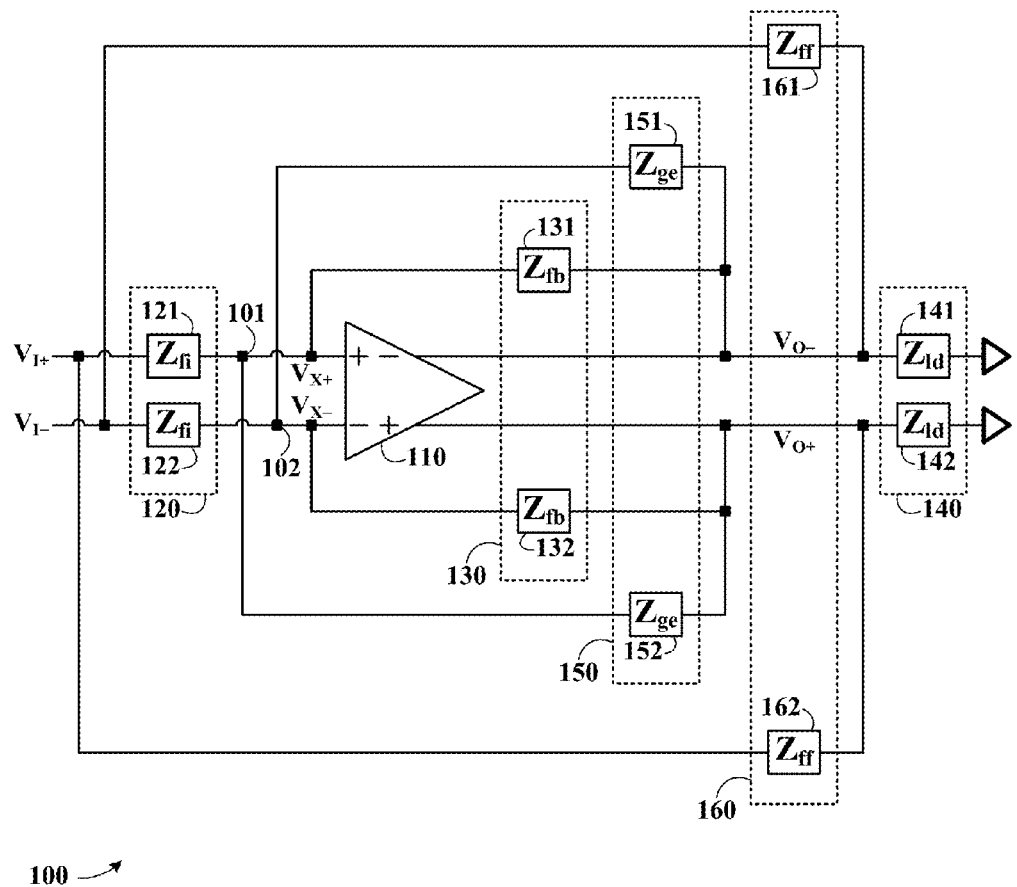
FIG. 1 shows a schematic diagram of a circuit in accordance with an embodiment of the present invention.

As depicted in FIG. 1, a circuit 100 in accordance with an embodiment of the present invention comprises: a differential amplifier 110 receiving an input signal $V_I$ via a feed-in network 120 (comprising feed-in circuits 121 and 122 of a feed-in impedance $Z_{fi}$) and outputting an output signal $V_O$ to a load network 140 (comprising load circuits 141 and 142 of a load impedance $Z_{ld}$); a negative feedback network 130 (comprising feedback circuits 131 and 132 of a feedback impedance $Z_{fb}$) providing a negative feedback from the output signal $V_O$ to an intermediate signal $V_X$ at circuit nodes 101 and 102, and a gain-enhancing network 150 (comprising gain-enhancing circuits 151 and 152 of a gain-enhancing impedance $Z_{ge}$) providing a positive feedback from the output signal $V_O$ to the intermediate signal $V_X$.

In a further embodiment, circuit 100 further comprises a feedforward network 160 (comprising feedforward circuits 161 and 162 of a feedforward impedance $Z_{ff}$) providing a direct feedforward from the input signal $V_I$ to the output signal $V_O$. Note that, if the gain enhancing network 150 and the feedforward network 160 are removed, circuit 100 will be reduced to a circuit that is well known in prior art. A distinct feature of circuit 100 is using the gain enhancing network 150 configured in a positive feedback topology to enhance a gain of differential amplifier 110. In the further embodiment wherein the feedforward network 160 is incorporated, an undesired direct feed-through from the input signal $V_I$ to the output signal $V_O$ via the feed-in network 120 and the feedback network 130 is cancelled. A principle of the present invention is described as follows.

Figure 2A:
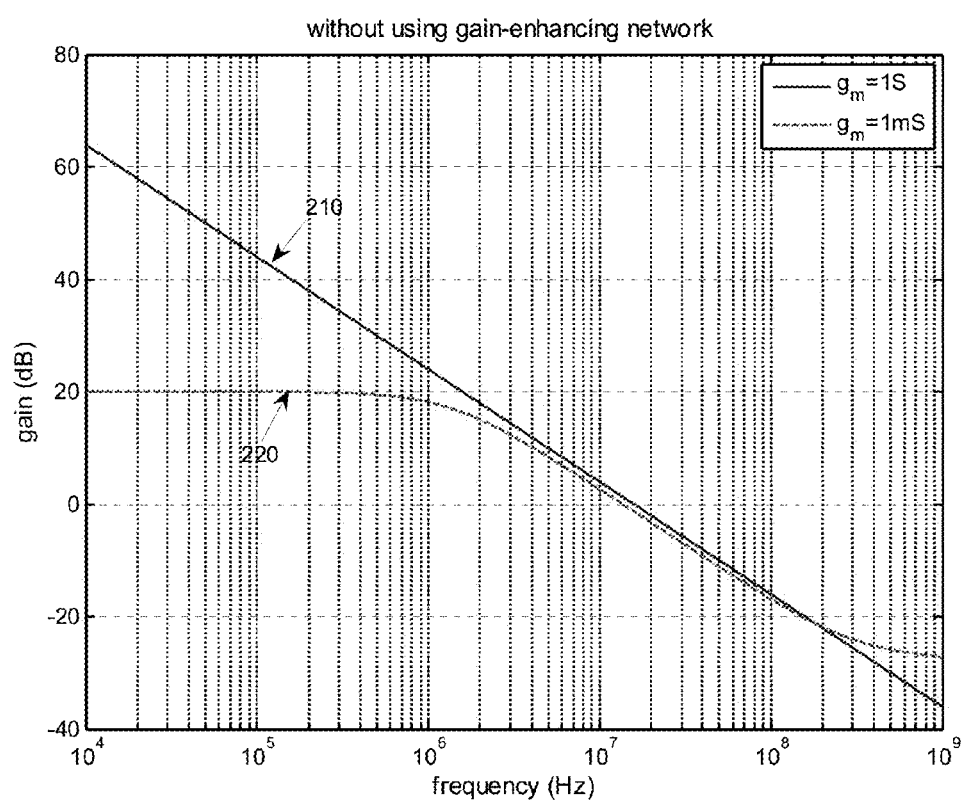
FIG. 2A is a chart that shows a frequency response of the circuit of FIG. 1 in the absence of the positive feedback gain enhancing circuit and the feedforward circuit.

For ease of analysis, the differential amplifier 110 is modeled as a voltage-controlled current source with a transconductance denoted as $g_m$; although in practice the differential amplifier 110 has a finite output impedance, the finite output impedance can be absorbed as a part of the load impedance $Z_{ld}$ for ease of analysis. By way of example but not limitation, consider an integrator application wherein: the feed-in impedance $Z_{fi}$ is embodied by a 10 KOhm resistor; the feedback impedance $Z_{fb}$ is embodied by a 1 pF capacitor; and the load impedance $Z_{ld}$ is embodied by a 100 fF capacitor in parallel with a 5 KOhm resistor (which is an output resistance of the differential amplifier 110 absorbed into the load network 140 as a part of the load impedance $Z_{ld}$). A frequency response of circuit 100, defined as $$\text{defined as} \equiv \frac{v_O}{v_I} = \frac{v_{O+} - v_{O-}}{v_{I+} - v_{I-}},$$

in the absence of the gain-enhancing network 150 and the feedforward network 160, is shown in FIG. 2A. Two traces 210 and 220 are shown. Trace 210 corresponds to a case where the transconductance $g_m$ is high (i.e., 1 S), while 220 corresponds to a case where the transconductance gm is low (i.e., 1 mS).

It is clear that, the transconductance $g_m$ needs to be high (such as 1 S for the case of trace 210) for circuit 100 to behave like an integrator; when the transconductance $g_m$ is low (such as 1 mS for the case of trace 220), circuit 100 behaves very differently from an integrator, in particular at low frequencies (say, under 2 MHz) and at high frequencies (say, above 300 MHz); the problem at low frequencies is due to insufficient gain of the differential amplifier 110, while the problem at high frequencies is due to an undesired direct feed-through from the input signal $V_I$ to the output signal $V_O$ via the feed-in network 120 and the feedback network 130. The gain enhancing network 150 configured in a positive feedback topology is used to alleviate the problem at low frequencies due to insufficient gain, while the feedforward network 160 is used to alleviate the problem at high frequencies due to the undesired direct feed-through. Let the DC gain of the differential amplifier 110 be $G_0$.

As known in prior art, a DC gain of a differential amplifier (such as 110) is equal to the transconductance $g_m$ times twice the single-end output resistance (which is 5 KOhm, the resistor part of the load impedance $Z_{ld}$). When $g_m$ is 1 mS, $G_0=1$ mS·2·5 KOhm=10, which is 20 dB, and therefore the gain of circuit 100 is limited to 20 dB at low frequencies for the case of trace 220. The intermediate signal $V_X$ is approximately equal to the output signal $V_O$ divided by the DC gain $G_0$, i.e., $V_X \approx V_O/G_0$. When $G_0$ is sufficiently large, $V_X$ is nearly zero and negligible. When $G_0$ is not sufficiently high, $V_X$ is no longer nearly zero and may not be neglected. To compensate the insufficient DC gain, the effect of $V_X$ must be cancelled. In circuit 100, the effect of $V_X$ is cancelled by a positive feedback of $V_O$ that results in a feedback signal at circuit nodes 101 and 102 that is equal to $V_X$ but of an opposite polarity, that is:

$$V_O \cdot Z_{fi}/(Z_{fi}+Z_{ge}) = V_X \tag{1}$$

Here, the factor $Z_{fi}/(Z_{fi}+Z_{ge})$ is the feedback factor from the output signal $V_O$ to the circuit nodes 101 and 102 via a voltage division. Rearrange (1) and obtain:

$$(Z_{fi}+Z_{ge})/Z_{fi} = V_O/V_X \tag{2}$$

Since $V_X \approx V_O/G_0$, we obtain.

$$Z_{ge} = (G_0-1)Z_{fi} \tag{3}$$

Figure 2B:
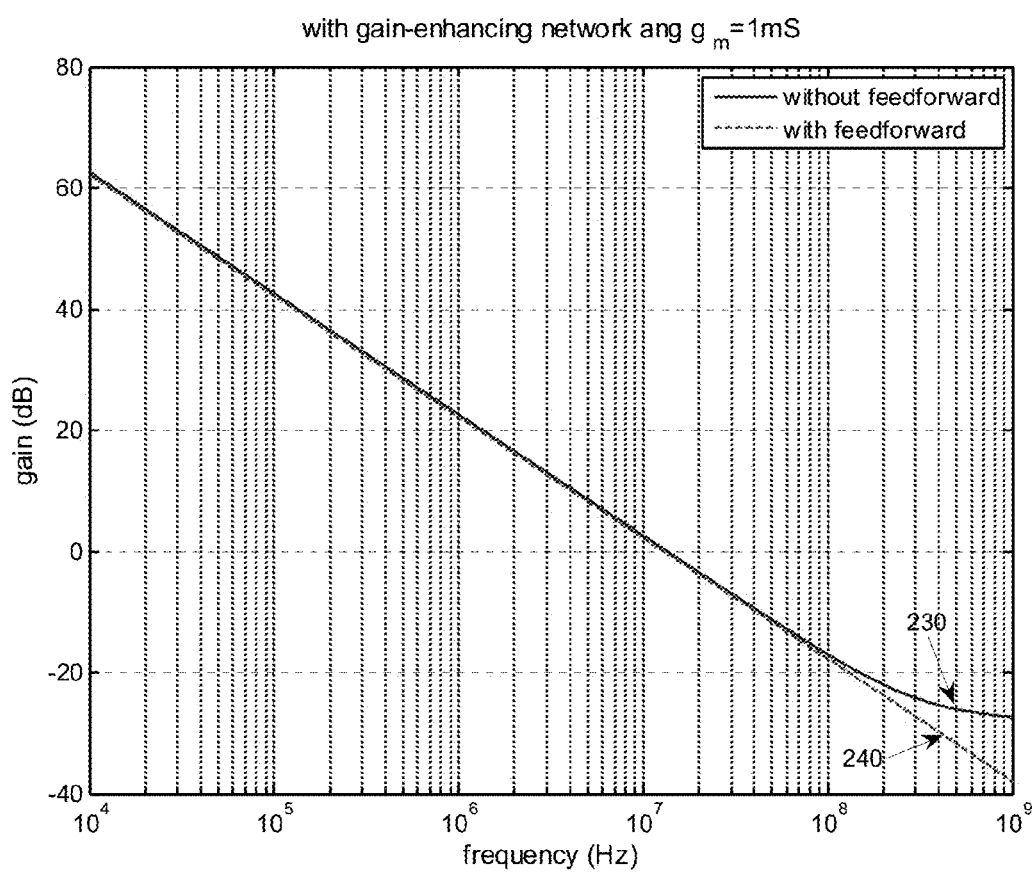
FIG. 2B is a chart that shows a frequency response of the circuit of FIG. 1 in the presence of the positive feedback gain enhancing circuit and the feedforward circuit.

Using equation (3), persons skilled in the art appreciate that $Z_{ge}$ needs to be $9 \cdot Z_{fi}$, for the case of trace 220 of FIG. 2A where $G_0=10$; that is, $Z_{ge}$ needs to be a 90 KOhm resistor (since $Z_{fi}=10$ KOhm). However, when $G_0$ is indicated to be 10, it is referring to the DC gain of differential amplifier 110 in the absence of the gain enhancing network 150. When a 90 KOhm resistor is used to embody $Z_{ge}$, it becomes an additional load to the differential amplifier 110 and thus lowers the DC gain of the differential amplifier. By taking into account the DC gain reduction due to the additional load, $Z_{ge}$ needs to be embodied by a 85 KOhm, which is slightly lower than 90 KOhm due to the reduced DC gain. By using an 85 KOhm resistor to embody $Z_{ge}$ for the gain enhancing impedance $Z_{ge}$, the frequency response of circuit 100 is shown in trace 230 of FIG. 2B. It is clear that the problem at low frequencies is due to insufficient gain being resolved and circuit 100 behaves like an integrator at low frequencies, even though the transconductance $g_m$ is low (only 1 mS). However, the problem at high frequencies remains.

To alleviate the problem at high frequencies due to the undesired direct feed-through, the feedforward impedance $Z_{ff}$ must be equal to $Z_{fi}+Z_{fb}$, i.e.

$$Z_{ff} = Z_{fi}+Z_{fb}. \tag{4}$$

When equation (4) is satisfied, the direct feed-through from $V_{I+}$ to $V_{O-}$ via the feed-in circuit 121 and the feedback circuit 131 is cancelled by the direct feedforward from $V_{I-}$ to $V_{O-}$ via the feedforward circuit 161, while the direct feed-through from $V_{I-}$ to $V_{O+}$ via the feed-in circuit 122 and the feedback circuit 132 is cancelled by the direct feedforward from $V_{I+}$ to $V_{O+}$ via the feedforward circuit 162. By using a 10 KOhm resistor in series with a 1 pF capacitor to implement the feedforward impedance $Z_{ff}$, the frequency response of circuit 100 is shown in trace 240 of FIG. 2B. It is clear that the problem at high frequencies due to the undesired direct feed-through from $V_I$ to $V_O$ is resolved.

Compared to prior art where the cross-coupled latch is used for gain enhancement and the noise contribution from the cross-coupled latch is similar to the noise contribution from the feed-in network, this present invention uses a positive feedback gain-enhancing network, which is of an impedance that is much higher than an impedance of the feed-in network and thus the noise it contributes is much less than the noise contribution from the feed-in network. This present invention, therefore, offers an improvement over the prior art.

Although an integrator application is used as example, it will be understood that the present invention is not limited to integrator applications. In a general case, the gain enhancing impedance is approximately equal to the DC gain (of the differential amplifier 110) minus one times an impedance of a parallel connection of the feed-in impedance $Z_{fi}$ and the feedback impedance $Z_{fb}$, i.e.

$$Z_{ge} = (G_0 - 1)(Z_{fi} \| Z_{fb}). \quad (5)$$

Here, "$\|$" denotes a parallel connection.

Equation (5) differs from equation (3) because the feedback impedance $Z_{fb}$ is very large and thus negligible compared with the feed-in impedance $Z_{fi}$ in the integrator application of interest mentioned earlier, while in a general case $Z_{fb}$ is part of the positive feedback network and needs to be considered.

Besides, equation (3) might also need to be modified to take into account a parasitic capacitance and/or a parasitic resistance, if applicable, at circuit nodes 101 and 102 to:

$$Z_{ge} = (G_0 - 1)(Z_{fi} \| Z_{fb} \| Z_{par}) \quad (6)$$

where $Z_{par}$ is a parasitic impedance (not shown in FIG. 1 but will be obvious to those of ordinary skill in the art) at circuit nodes 101 and 102. In addition, the feedforward circuits 161 and 162 need to be modified to include the parasitic impedance $Z_{par}$ so that, in the presence of the parasitic impedance $Z_{par}$, the direct feed-through from $V_{I+}$ to $V_{O-}$ via the feed-in circuit 121 and the feedback circuit 131 is matched and cancelled by the direct feedforward from $V_{I-}$ to $V_{O-}$ via the feedforward circuit 161, while the direct feed-through from $V_{I-}$ to $V_{O+}$ via the feed-in circuit 122 and the feedback circuit 132 is matched and cancelled by the direct feedforward from $V_{I+}$ to $V_{O+}$ via the feedforward circuit 162. In most applications, the parasitic impedance is much higher than the feed-in impedance and thus equations (3) and (4) are adequately accurate.

Figure 3:
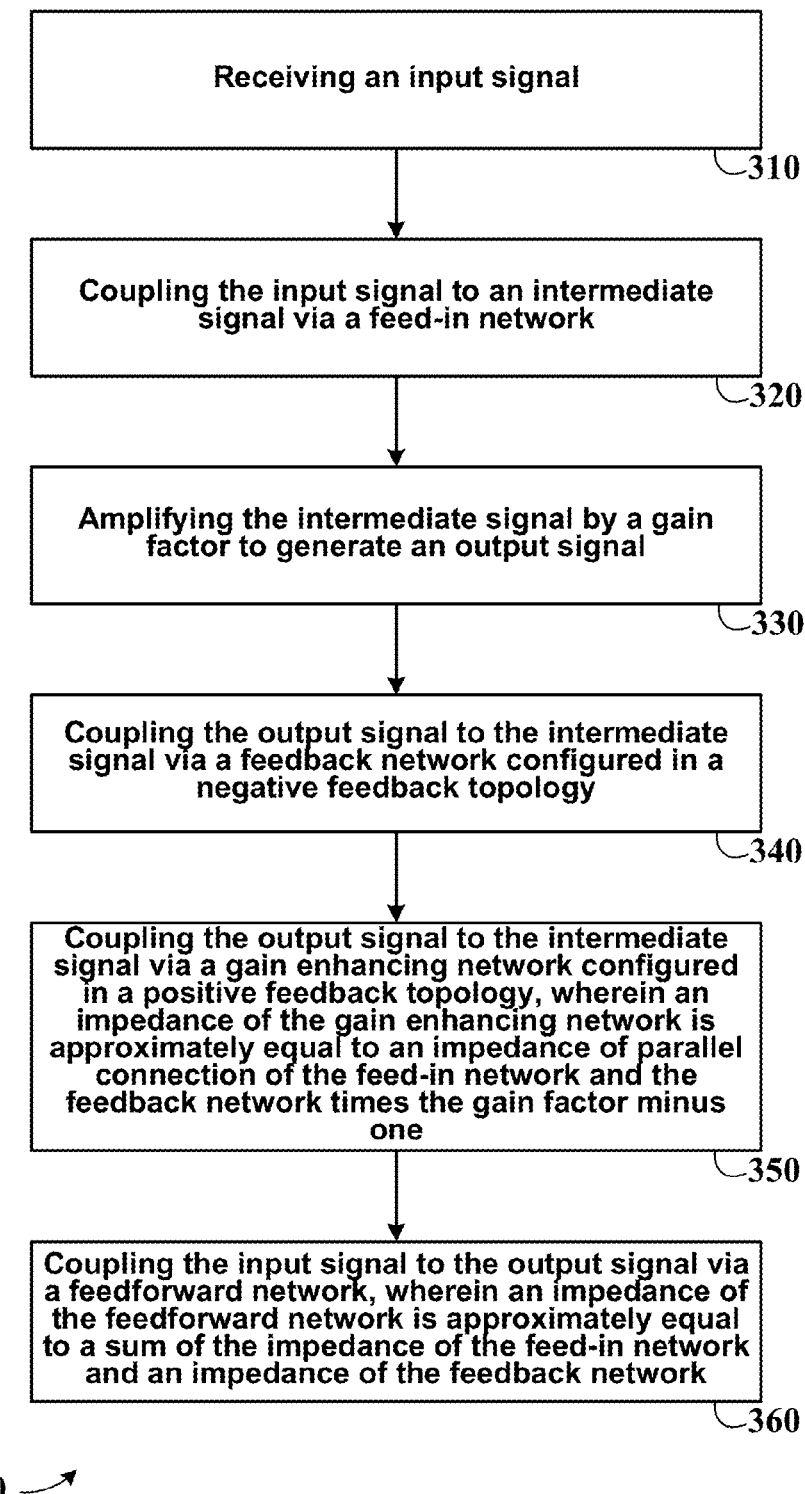
FIG. 3 is a flowchart showing a method for enhancing a differential amplifier.

As depicted in a flow diagram 300 shown in FIG. 3, a method comprises: step 310 for receiving an input signal; step 320 for coupling the input signal to an intermediate signal via a feed-in network; step 330 for amplifying the intermediate signal by a gain factor to generate an output signal; step 340 for coupling the output signal to the intermediate signal via a feedback network configured in a negative feedback topology; and step 350 for coupling the output signal to the intermediate signal via a gain enhancing network configured in a positive feedback topology, wherein an impedance of the gain enhancing network is approximately equal to an impedance of a parallel connection of the feed-in network and the feedback network times the gain factor minus one.

In a further embodiment, the method further comprises step 360 for coupling the input signal to the output signal via a feedforward network, wherein an impedance of the feedforward network is approximately equal to a sum of the impedance of the feed-in network and an impedance of the feedback network.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
   a feed-in network coupling a differential input signal to a differential intermediate signal;
   a differential amplifier amplifying the differential intermediate signal by a gain factor to output a differential output signal to a load network;
   a feedback network configured in a negative feedback topology coupling the differential output signal to the differential intermediate signal, the feedback network comprising two feedback circuits having substantially equal impedances, wherein a first feedback circuit is connected between the negative differential output signal and the positive differential intermediate signal and a second feedback circuit is connected between the positive differential output signal and the negative differential intermediate signal; and
   a gain enhancing network configured in a positive feedback topology coupling the differential output signal to the differential intermediate signal, wherein an impedance of the gain enhancing network is approximately equal to an impedance of the feed-in network times the gain factor minus one, the gain enhancing network comprising two gain enhancing circuits having substantially equal impedances, wherein a gain enhancing circuit is connected between the negative differential output signal and the negative differential intermediate signal and a second gain enhancing circuit is connected between the positive differential output signal and the positive differential intermediate signal.

2. The circuit of claim 1, wherein the feed-in network comprises a resistor of a feed-in impedance and the feedback network comprises a feedback capacitor.

3. The circuit of claim 2, wherein the gain enhancing network comprises a resistor of a resistance that is approximately equal to the feed-in resistance times the gain factor minus one.

4. The circuit of claim 1, wherein the circuit further comprises a feedforward network coupling the input signal to the output signal.

5. The circuit of claim 4, wherein an impedance of the feedforward network is approximately equal to a sum of the impedance of a feed-in impedance and an impedance of the feedback network.

6. A method comprising.
   receiving a differential input signal;
   coupling the differential input signal to a differential intermediate signal via a feed-in network;
   amplifying the differential intermediate signal by a gain factor to generate differential output signal;
   coupling the differential output signal to the differential intermediate signal via a feedback network configured in a negative feedback topology, the feedback network comprising two feedback circuits having substantially equal impedances, wherein a first feedback circuit is connected between the negative differential output signal and the positive differential intermediate signal and a second feedback circuit is connected between the positive differential output signal and the negative differential intermediate signal; and
   coupling the differential output signal to the differential intermediate signal via a gain enhancing network configured in a positive feedback topology, wherein an impedance of the gain enhancing network is approximately equal to an impedance of a parallel connection of the feed-in network and the feedback network times the gain factor minus one, the gain enhancing network comprising two gain enhancing circuits having substantially equal impedances, wherein a gain enhancing circuit is connected between the negative differential output signal and the negative differential intermediate signal and a second gain enhancing circuit is connected between the positive differential output signal and the positive differential intermediate signal.

7. The method of claim 6, wherein the feed-in network comprises a resistor of a feed-in impedance and the feedback network comprises a feedback capacitor.

8. The method of claim 7, wherein the gain enhancing network comprises a resistor of a resistance that is approximately equal to the feed-in resistance times the gain factor minus one.

9. The method of claim 6 further comprising coupling the input signal to the output signal via a feedforward network.

10. The method of claim 9, wherein an impedance of the feedforward network is approximately equal to a sum of the impedance of the feed-in network and an impedance of the feedback network.

\* \* \* \* \*